(12) United States Patent
Rao

(10) Patent No.: US 9,792,219 B2
(45) Date of Patent: *Oct. 17, 2017

(54) NONVOLATILE MEMORY SYSTEMS WITH EMBEDDED FAST READ AND WRITE MEMORIES

(71) Applicant: GREENTHREAD, LLC, Dallas, TX (US)

(72) Inventor: G. R. Mohan Rao, Allen, TX (US)

(73) Assignee: Si-Flash Drives, LLC, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/018,599

(22) Filed: Feb. 8, 2016

(65) Prior Publication Data

US 2017/0010975 A1 Jan. 12, 2017

Related U.S. Application Data

(63) Continuation of application No. 14/335,160, filed on Jul. 18, 2014, now Pat. No. 9,257,184, which is a continuation of application No. 13/967,649, filed on Aug. 15, 2013, now Pat. No. 8,817,537, which is a continuation of application No. 13/458,173, filed on
(Continued)

(51) Int. Cl.

| G06F 12/10 | (2016.01) |
|---|---|
| G11C 16/10 | (2006.01) |
| G11C 7/10 | (2006.01) |
| G11C 14/00 | (2006.01) |
| G11C 11/02 | (2006.01) |
| G11C 11/22 | (2006.01) |
| G11C 13/00 | (2006.01) |
| G11C 16/06 | (2006.01) |

(52) U.S. Cl.
CPC ............ *G06F 12/10* (2013.01); *G11C 7/1006* (2013.01); *G11C 7/1084* (2013.01); *G11C 11/02* (2013.01); *G11C 11/225* (2013.01); *G11C 13/0021* (2013.01); *G11C 14/00* (2013.01); *G11C 14/0018* (2013.01); *G11C 16/06* (2013.01); *G11C 16/10* (2013.01); *G06F 2212/205* (2013.01); *G06F 2212/214* (2013.01)

(58) Field of Classification Search
CPC ....... G11C 11/225; G11C 11/02; G11C 16/06; G11C 13/0021; G11C 7/1006; G11C 14/0018; G11C 14/00; G11C 7/1084; G11C 16/10; G06F 12/10; G06F 2212/214; G06F 2212/205
USPC .......................... 365/185.08, 185.11, 185.12
See application file for complete search history.

(56) References Cited

U.S. PATENT DOCUMENTS

| 4,811,303 A | 3/1989 | Hirai |
|---|---|---|
| 5,361,227 A | 11/1994 | Tanaka et al. |

(Continued)

OTHER PUBLICATIONS

"Coding for SSDs—Part 3" by E.Gooseart, Feb. 12, 2014.
(Continued)

*Primary Examiner* — Ly D Pham
(74) *Attorney, Agent, or Firm* — Munck Wilson Mandala LLP

(57) ABSTRACT

A nonvolatile memory system is described with novel architecture coupling nonvolatile storage memory with random access volatile memory. New commands are included to enhance the read and write performance of the memory system.

13 Claims, 10 Drawing Sheets

Related U.S. Application Data

Apr. 27, 2012, now Pat. No. 8,531,880, which is a continuation of application No. 12/915,177, filed on Oct. 29, 2010, now Pat. No. 8,194,452, which is a continuation of application No. 12/256,362, filed on Oct. 22, 2008, now Pat. No. 7,855,916.

(60) Provisional application No. 60/982,175, filed on Oct. 24, 2007.

(56) References Cited

U.S. PATENT DOCUMENTS

| | | | |
|---|---|---|---|
| 6,023,781 | A | 2/2000 | Hazama |
| 6,522,586 | B2 | 2/2003 | Wong |
| 6,614,703 | B2 | 9/2003 | Pitts et al. |
| 7,099,215 | B1 | 8/2006 | Rotenberg et al. |
| 7,286,401 | B2 | 10/2007 | Ishimaru et al. |
| 7,324,385 | B2 | 1/2008 | Mobley et al. |
| 7,433,258 | B2 | 10/2008 | Rao |
| 7,855,916 | B2 | 12/2010 | Rao |
| 7,991,944 | B2 | 8/2011 | Lee et al. |
| 8,219,776 | B2 | 7/2012 | Forhan et al. |
| 8,335,907 | B2 | 12/2012 | Sinclair et al. |
| 8,531,880 | B2 | 9/2013 | Rao |
| 9,170,938 | B1 | 10/2015 | Walsh et al. |
| 9,213,663 | B2 | 12/2015 | Li et al. |
| 9,218,279 | B2 | 12/2015 | Tomlin et al. |
| 9,257,184 | B2 * | 2/2016 | Rao .................. G11C 16/10 |
| 2006/0087893 | A1 | 4/2006 | Nishihara et al. |
| 2006/0155922 | A1 | 7/2006 | Gorobets et al. |
| 2008/0301359 | A1 | 12/2008 | Smith et al. |
| 2010/0077136 | A1 | 3/2010 | Ware et al. |
| 2011/0060870 | A1 | 3/2011 | Rao |

OTHER PUBLICATIONS

"Innodisk power secure technology for SSDs", Innodisk white paper, Aug. 2013.
"Understanding SSDs", Samsung web site.
"A survey of address translation technologies" by D. Ma et al, 2014 ACM.
Qingsong Wei et al., WAFTL: A Workload Adaptive Flash Translation Layer with Data Partition, IEEE 27th Symposium on Massive Storage Systems and Technologies (MSST), May 23-27, 2011.
Taeho Kgil et al., Improving NAND Flash Based Disk Caches, International Symposium on Computer Architecture, Copyright 2008 IEEE.
Samsung Electronics Co., Ltd. ,7th International Symposium on Advanced Gate Stack Technology, RRAM Technology from an Industrial Perspective, Process Development Team/RRAM PJT In-Gyu Baek, Sep. 2010.
Paolo Pavan et al., Flash Memory Cells—An Overview, Proceedings of the IEEE, vol. 85, No. 8, Aug. 1997.
Yoshihisa Iwata et al., A High-Density NAND EEPROM with Block-Page Programming for Microcomputer Applications, IEEE Journal of Solid-State Circuits, vol. 25, No. 2, Apr. 1990.
Tae-Sung Jung et al., A 117-mm2 3.3-V Only 128-Mb Multilevel NAND Flash Memory for Mass Storage Applications, IEEE Journal of Solid-State Circuits, vol. 31, No. 11, Nov. 1996.
Masayoshi Ohkawa et al., A 98 mm2 Die Size 3.3V 64-Mb Flash Memory with FN-NOR Type Four-Level Cell, IEEE Journal of Solid-State Circuits, vol. 31, No. 11, Nov. 1996.
Masaki Momodomi et al., An Experimental4-Mbit CMOS EEPROM with a NAND-Structured Cell, IEEE Journal of Solid-State Circuits, vol. 24, No. 5, Oct. 1989.
Ken Takeuchi et al., A Multipage Cell Architecture for High-Speed Programming Multilevel NAND Flash Memories, IEEE Journal of Solid-State Circuits, vol. 33, No. 8, Aug. 1998.
Shigeru Atsumi et al., A Channel-Erasing 1.8-V-Only 32-Mb NOR Flash EEPROM with a Bitline Direct Sensing Scheme, IEEE Journal of Solid-State Circuits, vol. 35, No. 11, Nov. 2000.
Taehee Cho et al., A Dual-Mode NAND Flash Memory: 1-Gb Multilevel and High-Performance 512-Mb Single-Level Modes, IEEE Journal of Solid-State Circuits, vol. 36, No. 11, Nov. 2001.
Douglas J. Lee et al., Control Logic and Cell Design for a 4K NVRAM, IEEE Journal of Solid-State Circuits, vol. SC-18, No. 5, Oct. 1983.
Duane H. Oto et al., High-Voltage Regulation and Process Considerations for High-Density 5 V-Only E2PROM's, IEEE Journal of Solid-State Circuits, vol. SC-18, No. 5, Oct. 1983.
Gheorghe Samachisa et al., A 128K Flash EEPROM Using Double-Polysilicon Technology, IEEE Journal of Solid-State Circuits, vol. SC-22, No. 5, Oct. 1987.
Nelson Duann, Silicon Motion, Inc., Flash Memory Summit, SIC & MIC Hybrid, Santa Clara, CA, Aug. 2008.
Simona Boboiia et al., Write Endurance in Flash Drives: Measurements and Analysis, Usenix Conference on File and Storage Technologies, San Jose, CA, Feb. 2010.
Simona Boboiia et al. Write Endurance in Flash Drives: Measurements and Analysis, Handout at Unsenix Conference on File and Storage Technologies, San Jose, CA, Feb. 2010.
Silicon Systems, Increasing Flash SSD Reliability, StorageSearch. com, Apr. 2005.
Ismael Chang Ghalimi, Intalio, An Intalio White Paper, Cloud Computing is Memory Bound, May 2010.
Hynix, 32Gb NAND Flash, HY27UK08BGFM, Product Description Sheet, Feb. 2007.
Chris Evans, Consultant with Langton Blue, SearchStorage.co.UK, Enterprise MLC: How flash vendors are boosting MLC write endurance, Jun. 3, 2011.
Jesung Kim et al., A Space-Efficient Flash Translation Layer for Compactflash Systems, IEEE Transactions on Consumer Electronics, vol. 48, No. 2, May 2002.
Garth Goodson et al., Design Tradeoffs in a Flash Translation Layer, HPCA WEST 2010 (High Perf Comp Arch Conference, Bangalore, India.
Abdul Rub Aamer Mohammed, Improving Hot Data Identification for Hybrid SLC/MLC Device; CSci 8980—Advanced Storage Systems, Spring 2009.
Yang Hu, Achieving Page-Mapping FTL Performance at Block-Mapping FTL Cost by Hiding Address Translation, 26th IEEE Symposium on Massive Storage Systems and Technologies (MSST) May 3-7, 2010.
Clinton w. Smullen, IVet al., Accelerating Enterprise Solid-State Disks with Non-Volatile Merge Caching, 2010 International Green Computing Conference, Aug. 15-18, 2010.
Monolith 3D, Inc., Introducing our monolithic 3D resistive memory architecture, http://www.monolithic3d.com/2/post/2011/06/introducing-our-3d-resistive-memory-architecture.html, Jun. 27, 2011.
Song Jiang et al., S-FTL: An Efficient Address Translation for Flash Memory by Exploiting Spatial Locality, Proceedings of the MSST 2011, May 2011.
Greg Atwood et al., Intel Strata Flash TM Memory Technology Overview, Intel Technology Journal Q4 1997.
Moinuddin K. Qureshi et al., Morphable Memory System: A Robust Architecture for Exploiting Multi-Level Phase Change Memories, International Symposium on Computer Architecture, Saint-Malo, France, Jun. 19-23, 2010.
Abhishek Rajimwale et al., Block Management in Solid-State Devices, Usenix Conference, Jun. 14-19, 2009.
Brendan Gregg et al., Sun Storage 7000 Unified Storage System L2ARC: Second Level Adaptive Replacement Cache, Oracle White Paper—Sun Storage 7000 Unified Storage System L2ARC, May 2010.
Chunqiang Tang, FVD: a High-Performance Virtual Machine Image Format for Cloud, USENIX Conference Jun. 2011.
Anand Lal Shimpi, AnandTech, The Crucial m4 (Micron C400) SSD Review, Mar. 31, 2011.
Anand Lal Shimpi, AnandTech, The Intel SSD 320 Review: 25nm G3 is Finally Here, Mar. 28, 2011.
Micron Technology, Inc., TN-29-42: Wear-Leveling Techniques in NAND Flash Devices Introduction, Oct. 2008.
Roberto Bez et al., Introduction to Flash Memory, Proceedings of the IEEE, vol. 91, No. 4, Apr. 2003.

(56) References Cited

OTHER PUBLICATIONS

Seagate Technology LLC, The Transition to Advanced Format 4K Sector Hard Drives, Apr. 2010.
Tae-Sun Chung et al., A Survey of Flash Translation Layer, Journal of Systems Architecture 55, pp. 332-343, 2009.
Intel, Understanding the Flash Translation Layer (FTL) Specification, Dec. 1998.
Numonyx, White Paper, Designing a cellular low power DDR non-volatile memory system with Numonyx TM Velocity LP TM NV-RAM, Jul. 1998.
Micron Technology, Inc., Technical Note, NAND Flash Performance Increase Using the Micron Page Read Cache Mode Command, TN-29-01 Rev. E, May 2007.
Samsung Electronics, Flash Memory Product Specification K9F1G08XOA, Jan. 27, 2006.
Atsushiinoue et al., Toshiba, NAND Flash Applications Design Guide, System Solutions from Toshiba America Electronic Components, Inc., Revision 1.0, Apr. 2003.

* cited by examiner

FIG. 6
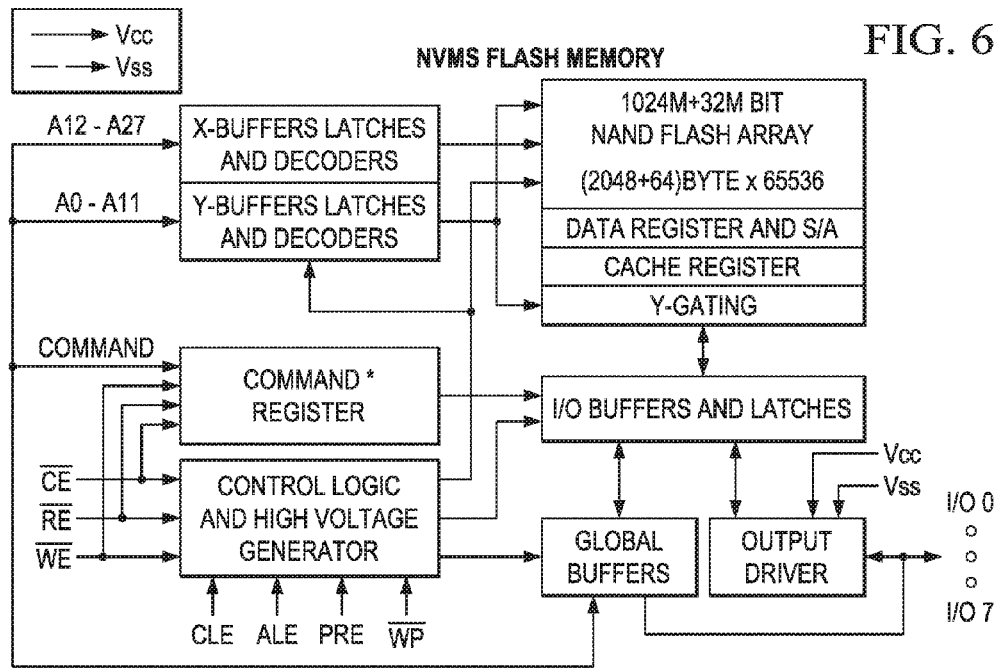
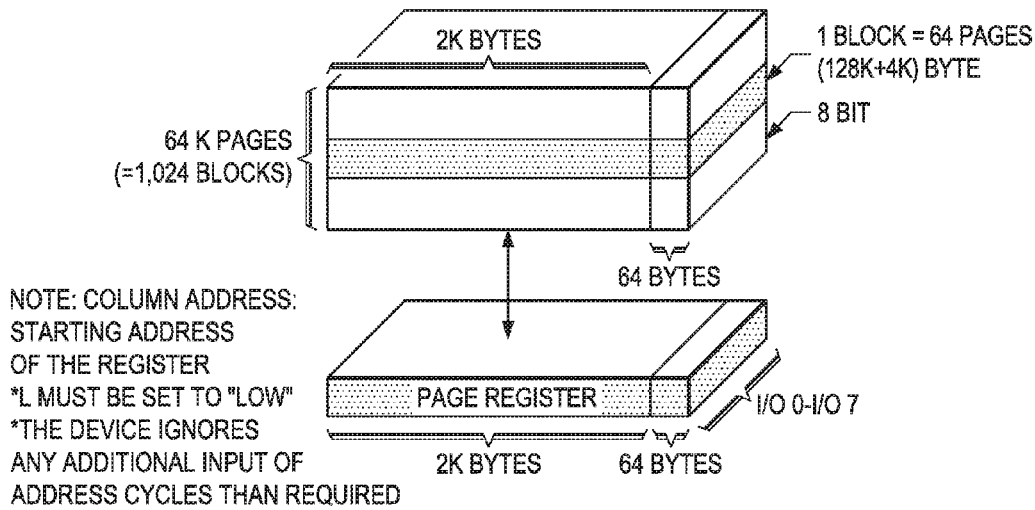
NOTE: COLUMN ADDRESS:
STARTING ADDRESS
OF THE REGISTER
*L MUST BE SET TO "LOW"
*THE DEVICE IGNORES
ANY ADDITIONAL INPUT OF
ADDRESS CYCLES THAN REQUIRED
|  | I/O 0 | I/O 1 | I/O 2 | I/O 3 | I/O 4 | I/O 5 | I/O 6 | I/O 7 |  |
|---|---|---|---|---|---|---|---|---|---|
| 1st CYCLE | A0 | A1 | A2 | A3 | A4 | A5 | A6 | A7 | COLUMN ADDRESS |
| 2nd CYCLE | A8 | A9 | A10 | A11 | *L | *L | *L | *L | COLUMN ADDRESS |
| 3rd CYCLE | A12 | A13 | A14 | A15 | A16 | A17 | A18 | A19 | ROW ADDRESS |
| 4th CYCLE | A20 | A21 | A22 | A23 | A24 | A25 | A26 | A27 | ROW ADDRESS |

NONVOLATILE MEMORY SYSTEMS

K9F1G08R0A
K9F1G08U0A   K9K2G08U1A                                    FLASH MEMORY 128M x 8 BIT/256M x 8 BIT NAND FLASH MEMORY

| PART NUMBER | Vcc RANGE | ORGANIZATION | PKG TYPE |
|---|---|---|---|
| K9F1G08R0A | 1.65 ~ 1.95V | X8 | FBGA |
| K9F1G08U0A-Y, P | 2.7 ~ 3.6V | | TSOP1 |
| K9F1G08U0A-V, F | | | WSOP1 |
| K9K2G08U1A-1 | | | 52-ULGA |

FEATURES

- VOLTAGE SUPPLY
  - 1.8V DEVICE(K9F1G08R0A): 1.65V~1.95V
  - 3.3V DEVICE(K9F1G08U0A): 2.7V~3.6V
- ORGANIZATION
  - MEMORY CELL ARRAY:
    (128M+4,096K)BIT x 8BIT
  - DATA REGISTER:(2K+64)BIT x 8BIT
  - CACHE REGISTER:(2K+64)BIT x 8BIT
- AUTOMATIC PROGRAM AND ERASE
  - PAGE PROGRAM: (2K+64)BYTE
  - BLOCK ERASE: (128K+4K)BYTE
- PAGE READ OPERATION
  - PAGE SIZE: 2K-BYTE
  - RANDOM READ: 25$\mu$s(MAX)
  - SERIAL ACCESS: 30ns(MIN)-3.3v DEVICE
                  50ns(MIN)-1.8v DEVICE
- FAST WRITE CYCLE TIME
  - PROGRAM TIME: 200$\mu$s(TYP)
  - BLOCK ERASE TIME: 200ms(TYP)
- COMMAND/ADDRESS/DATA MULTIPLEXED I/O PORT
- HARDWARE DATA PROTECTION
  - PROGRAM/ERASE LOCKOUT DURING POWER TRANSITIONS
- RELIABLE CMOS FLOATING-GATE TECHNOLOGY
  - ENDURANCE: 100K PROGRAM/ERASE CYCLES
  - DATA RETENTION: 10 YEARS
- COMMAND REGISTER OPERATION
- CACHE PROGRAM OPERATION FOR HIGH PERFORMANCE PROGRAM
- INTELLIGENT COPY-BACK OPERATION
- UNIQUE ID FOR COPYRIGHT PROTECTION
- PACKAGE:
  - K9F1G08R0A-GCB0/GIB0
    63-BALL FBGA
  - K9F1G08R0A-JCB0/JIB0
    63-BALL FBGA-Pb-FREE PACKAGE
  - K9F1G08U0A-YCB0/YIB0
    48-PIN TSOP I (12x20/0.5mm PITCH)
  - K9F1G08U0A-VIB0
    48-PIN WSOP I (12x17x0.7mm)
  - K9F1G08U0A-PCB0/PIB0
    48-PIN TSOP I (12x20/0.5mm PITCH)-Pb-FREE PACKAGE
  - K9F1G08U0A-FIB0
    48-PIN WSOP I (12x17x0.7mm)-Pb-FREE PACKAGE
    *K9F1G08U0A-V,F(WSOPI) IS THE SAME DEVICE AS K9F1G08U0A-Y,P(TSOP1) EXCEPT PACKAGE TYPE
  - K9K2G08U1A-ICB0/IIB0
    52-ULGA (12x17x0.65mm)

FIG. 8

NONVOLATILE MEMORY SYSTEMS

- BATTERY BACK UP SRAM/AND/OR DRAM WITH FLASH
  (OR SIMILAR NONVOLATILE MEMORY WITH SLOW WRITE TIME)

HAVE THE SRAM AND/OR DRAM STORE WRITES AND WRITE TO
  NV MEMORY ONLY IN "IDLE" OR "NO INTERRUPT WITH RAM" TIME

PROVIDE BATTERY BACK UP FOR RAM SO DATA IN RAM IS NOT LOST

DRAM AND/OR SRAM DENSITY CAN BE ABOUT 1/10th (10%) OF NV DENSITY
  e.g., 256Mb OF RAM FOR 3 TO 4 GBITS OF NV(LIKE FLASH)

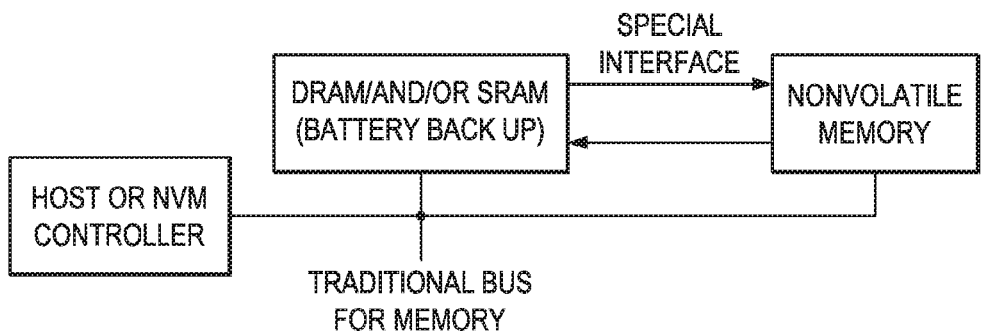

THIS GOES BEYOND THE "MULTI CHIP PACKAGE SOLUTIONS"
OF PSRAM/FLASH OFFERED IN CELL PHONES TODAY

- INCLUDE NEW COMMANDS IN REGISTERS OF BOTH, RAM AND NV

FIG. 10

NONVOLATILE MEMORY SYSTEMS

NONVOLATILE MEMORY MODULE WITH VOLATILE MEMORY

- VOLATILE MEMORY CAN BE DRAM, SRAM OR COMBINATION
- NONVOLATILE MEMORY CAN BE ANY KIND OF FLASH, MAGRAM, FeRAM, CNT ETC.
- READ/WRITE CAN BE THROUGH VM(VOLATILE MEMORY) WHICH ACTS AS A CACHE BUFFER (BOTH DATA AND ADDRESS, COULD BE COMMAND AS WELL)

NONVOLATILE MEMORY SYSTEMS WITH EMBEDDED FAST READ AND WRITE MEMORIES

CROSS-REFERENCE TO RELATED APPLICATIONS

This application is a Continuation of U.S. patent application Ser. No. 14/335,160, filed Jul. 18, 2014, published on Mar. 12, 2015, as U.S. Publication No. 2015-0070991. Application Ser. No. 14/335,160 is a Continuation of U.S. patent application Ser. No. 13/967,649, filed Aug. 15, 2013, published on Mar. 13, 2014, as U.S. Publication No. 2014-0071752, now U.S. Pat. No. 8,817,537, issued on Aug. 26, 2014. Application Ser. No. 13/967,649 is a Continuation of U.S. patent application Ser. No. 13/458,173, filed Apr. 27, 2012, published on Sep. 20, 2012, as U.S. Publication No. 2012-0239863, now U.S. Pat. No. 8,531,880, issued on Sep. 10, 2013. Application Ser. No. 13/458,173 is a Continuation of U.S. patent application Ser. No. 12/915,177, filed Oct. 29, 2010, published on Mar. 10, 2011, as U.S. Publication No. 2011-0060870, now U.S. Pat. No. 8,194,452, issued on Jun. 5, 2012. Application Ser. No. 12/915,177 is a Continuation of U.S. patent application Ser. No. 12/256,362, filed Oct. 22, 2008, published on Apr. 30, 2009, as U.S. Publication No. 2009-0109787, now U.S. Pat. No. 7,855,916, issued on Dec. 21, 2010. Application Ser. No. 12/256,362 claims benefit of U.S. Provisional Application No. 60/982,175, filed Oct. 24, 2007.

U.S. Pat. Nos. 8,817,537; 8,531,880; 8,194,452; and 7,855,916; and Patent Application Publication Nos. 2015-0070991; 2014-0071752; 2012-0239863; 2011-0060870; and 2009-0109787 are hereby incorporated by reference in their entireties.

BACKGROUND

Nonvolatile memory systems, subsystems and integrated circuits are used in multiple consumer, computer and communications applications. They can be a NAND flash memory IC or NOR flash memory. Part of the memory system may contain volatile memory like static random access memory (SRAM) or dynamic random access memory (DRAM). They can be many IC's mounted on a memory card or module. A subsystem may contain at least one such module and a memory controller. A system may contain several subsystems as well as multi core CPU's (Central Processing Unit). The memory integrated circuits used in such a system may be SLC (single level) or MLC (multi level) storage. The read/write access ports to the system may be single ported or multi ported.

Today's dominant memory is flash. In flash, the dominant architecture is NAND flash. In spite of the fact that the internal IC architecture of NAND (or for that matter other flash architectures like NOR, OneNAND™) has "page" architecture for read and write access, the performance (read time, program/write time) is slow compared to volatile memory systems built with SRAMs and DRAMs. The "page" architecture in NAND indeed has "static latches" that can temporarily store data as a buffer (one page per block), and sometimes have an additional "write cache buffer" for the whole IC. The page is 1 KB (1,024 bytes) to 2 KB (2,048 bytes). Each nonvolatile memory block of NAND flash memory cells, may have 64 to 128 pages (or, 128 KB to 256 KB). Still, the performance is relatively poor to mediocre at best from a randomly and independently accessible perspective per each byte of data. The "page buffered architecture" of today's NAND flash memory does not lend itself to true, fast, read and write memory access for SSD (solid state disk) and similar commercial applications in PCs and servers for data computation, storage and multimedia execution.

The invention described in this utility patent application focuses on ways to modify the already existing "buffers" in an optimal manner to enhance the random access performance of nonvolatile IC, subsystem and system. The volatile random access memory (RAM) in a preferred embodiment is a 6-transistor SRAM memory cell at the core, and complete peripheral address decoding circuitry for independent accessible access (read, write etc) at a fine grain level of a bit, or byte. In another embodiment, the volatile RAM in each block can be an 8-transistor dual-ported SRAM. In another embodiment, the nonvolatile memory can be a DRAM. The invention is applicable to other nonvolatile or pseudo non volatile memories like PCM (phase change memory), nano crystalline memory, charge trapped memory, ferroelectric memory, magnetic memory, plastic memory and similar embodiments.

SUMMARY

The preferred embodiment adds new commands to be executed in the Command Register of the NVM (nonvolatile memory). In other embodiments, these commands can be shared between the NVM IC and memory controller. Prior art NVM IC's have limited commands like (1) read page in flash; (2) erase block in flash; (3) program page in flash, etc. With this invention, new additional commands are executed: (4) read page in the SRAM of the block only; (5) read new page from the nonvolatile memory (NVM) block; (6) write page into SRAM of the block, but, not program into the NVM block until such a command is additionally given. This invention provides every page of each NVM block as an independently accessible random access memory to perform load/store applications, as well as a coupled memory to the assigned NVM block. Each NVM NAND flash may have 1,024 such blocks. Each block is typically 64 kilobytes in density. Page for each block is typically 1 to 2 kilobytes and each bit is independently addressable in a random manner, as well as accessed in a random manner. Error correction and detection to the memory on a page basis can be implemented as well either on the NVM IC or in the memory controller.

Another preferred embodiment selects any of the currently unused blocks and uses the SRAM pages in those blocks to perform other operations as necessary. Such data manipulating operations can be arithmetic and/or logic operations. In another preferred embodiment, the "volatile memory of a page" is a DRAM. That DRAM, again, is independently accessible and addressable in a random manner.

BRIEF DESCRIPTION OF THE DRAWINGS

For a more complete understanding, reference is now made to the following description taken in conjunction with the accompanying Drawings in which:

FIG. 6 shows a current NAND flash chip architecture by Samsung.

FIG. 8 shows some operational features of the above Samsung flash memory.

FIG. 10 shows improved features of this invention compared to currently available (commercial) multichip NVMS solutions.

DETAILED DESCRIPTION

Figure 1:
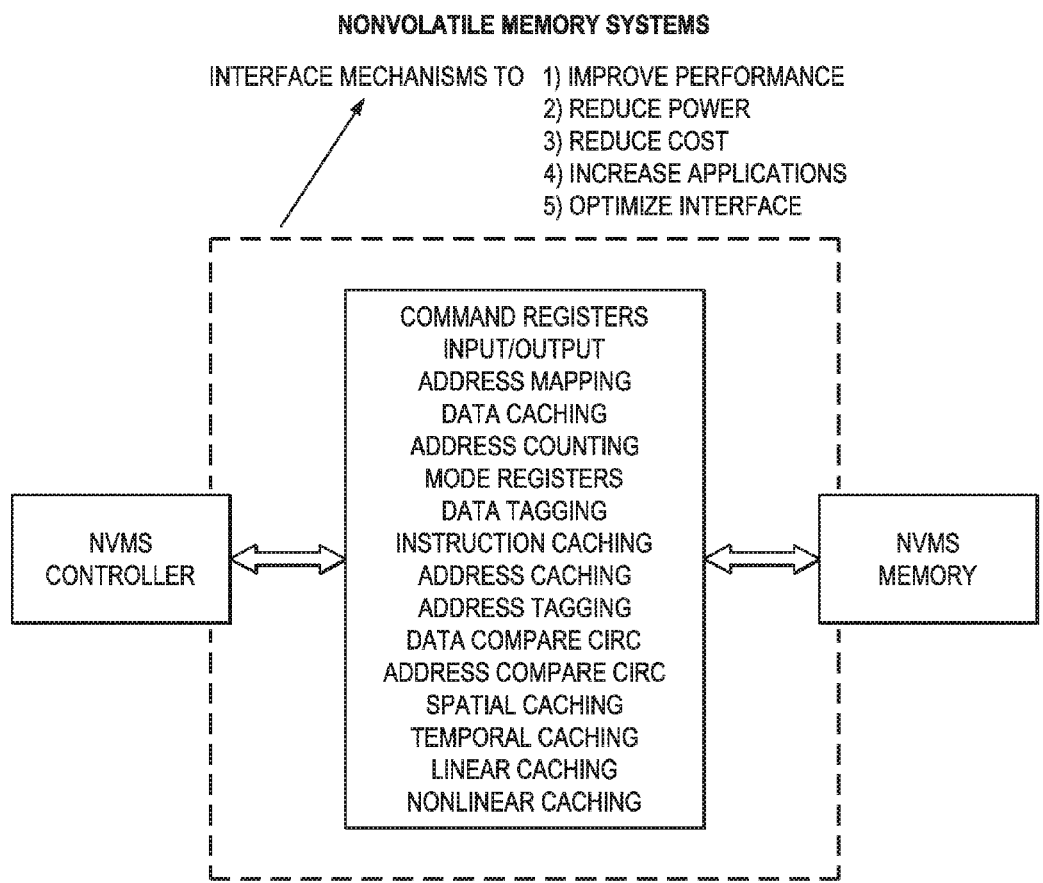
FIG. 1 is a diagram showing a nonvolatile memory system with features as described for the present invention.
Figure 2:
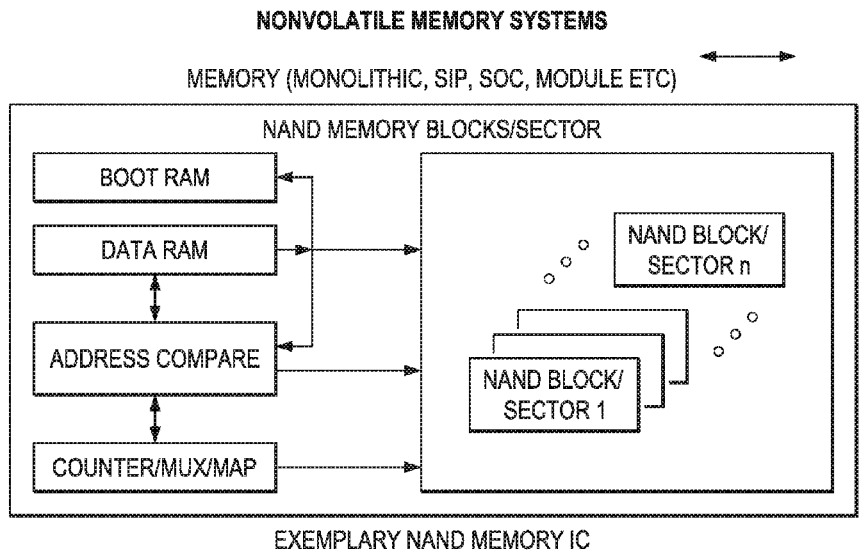
FIG. 2 shows an exemplary NAND memory integrated circuit as one element of the NVMS (nonvolatile memory system).
Figure 3:
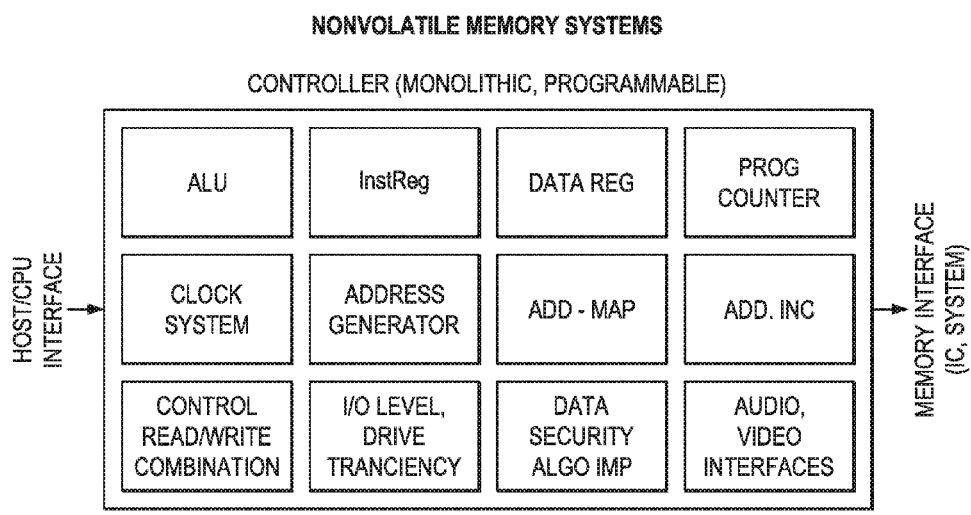
FIG. 3 shows various components of a controller for the nonvolatile memory system (NVMS) of this invention.
Figure 4:
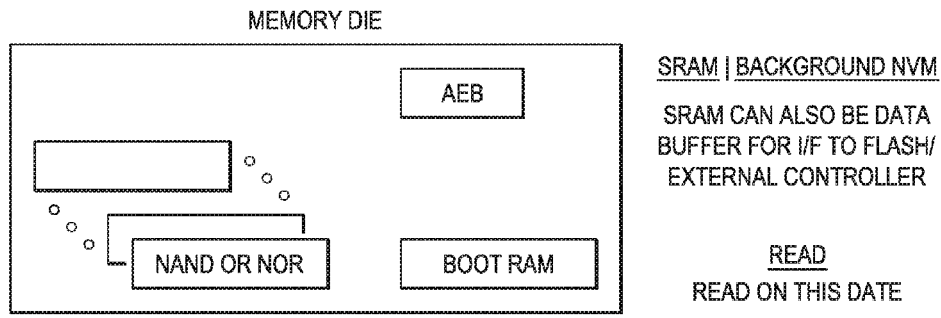
FIG. 4 shows a novel implementation of block erase per this invention.
Figure 5:
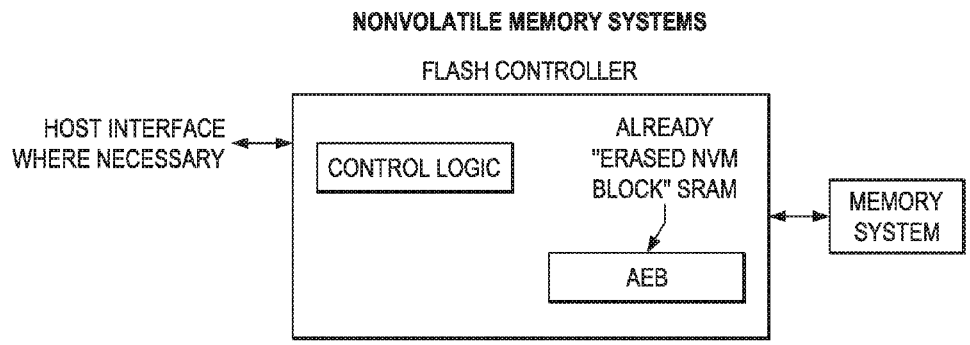
FIG. 5 shows a flash memory controller with block erase feature.

Referring now to the drawings, wherein like reference numbers are used herein to designate like elements throughout, the various views and embodiments of nonvolatile memory systems with embedded fast read and write memories are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Each NAND flash memory commercially available (in various pin outs/densities) today has a 512 B-1 KB-2 KByte page in a 64 Kb to 128K Byte block (a block contains at least one sector), 64 rows worth of data, 1 page/sector. To write one page takes about 200 µs. There are about 1,024 sectors in a 1 Gbit flash (NAND). So each NAND flash chip has 1 Mb SRAM (1 k pages). The invention requires each page to have "bit-to-bit" NVM back up (nonvolatile SRAM). So a page can be copied directly to the NVM as needed. This additional row can be in the sector itself. Address/control logic to accommodate this page can be easily done in the sector, if needed.

Page invention—Modify page as shown in Samsung K9F1G08R0A (1 Gbit NANDflash). In the Samsung device, Page is approximately 2 KByte+64 bits (for some kind of Ecc) in each 128 KByte block. There are 1K blocks, each of 128 KBytes (inclusive of Page). The Page has no direct identity (namely, it is not a register or RAM with independent random address and command executions)—it is temporary storage buffer to help execute read/write to nonvolatile array. Since each block (sector) is addressable, one can have a "Tag address bit"—if enabled it can activate "page addressing."

Figure 7:
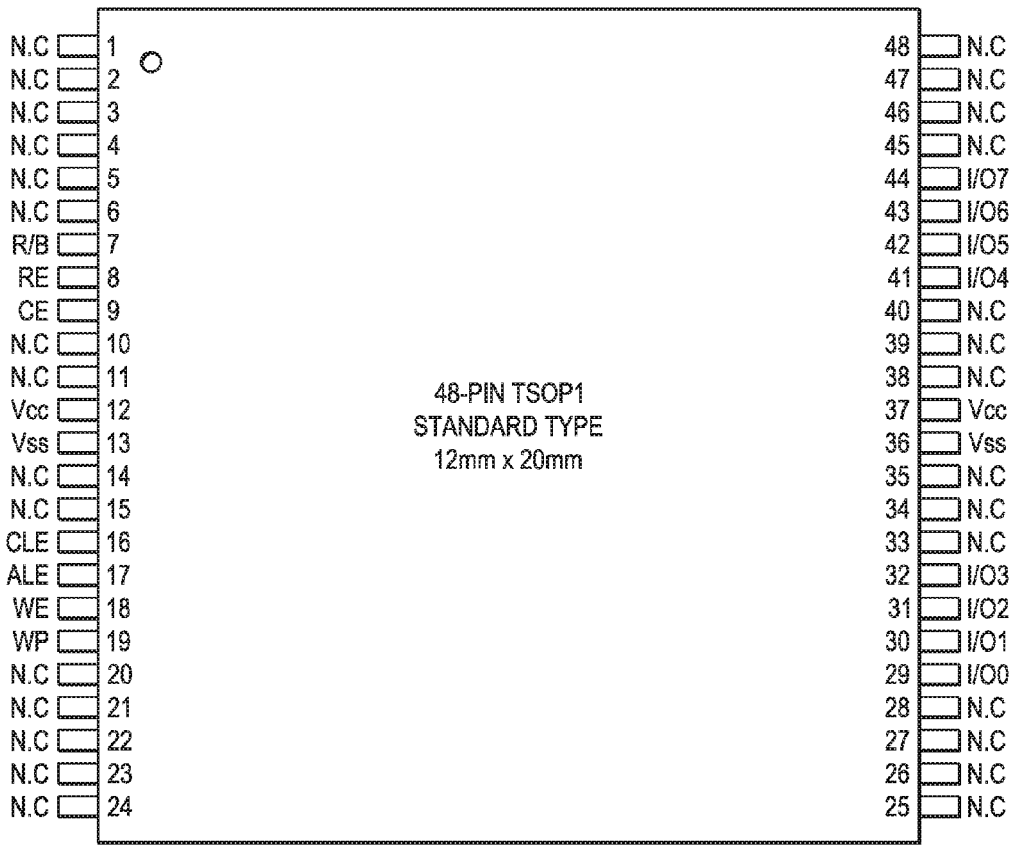
FIG. 7 shows a pin out for a 1 Gb Samsung flash memory.
Figure 9:
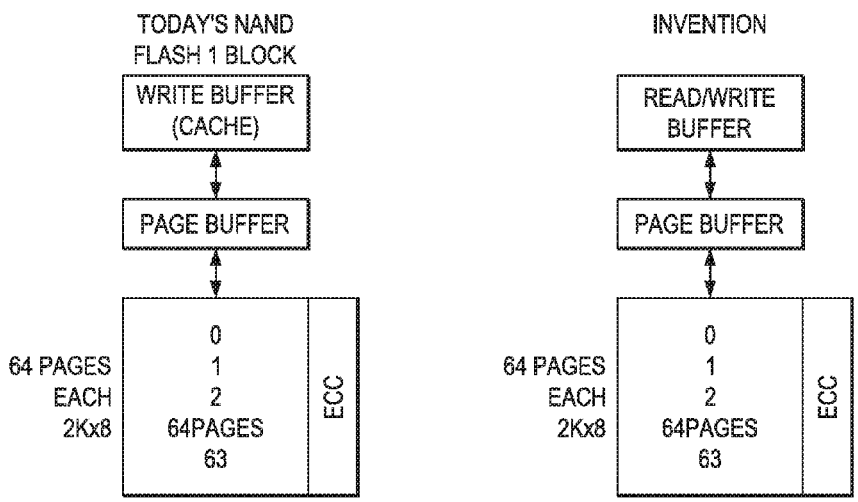
FIG. 9 shows how the invention of this patent distinguishes itself from today's nonvolatile memory.
Figure 11:
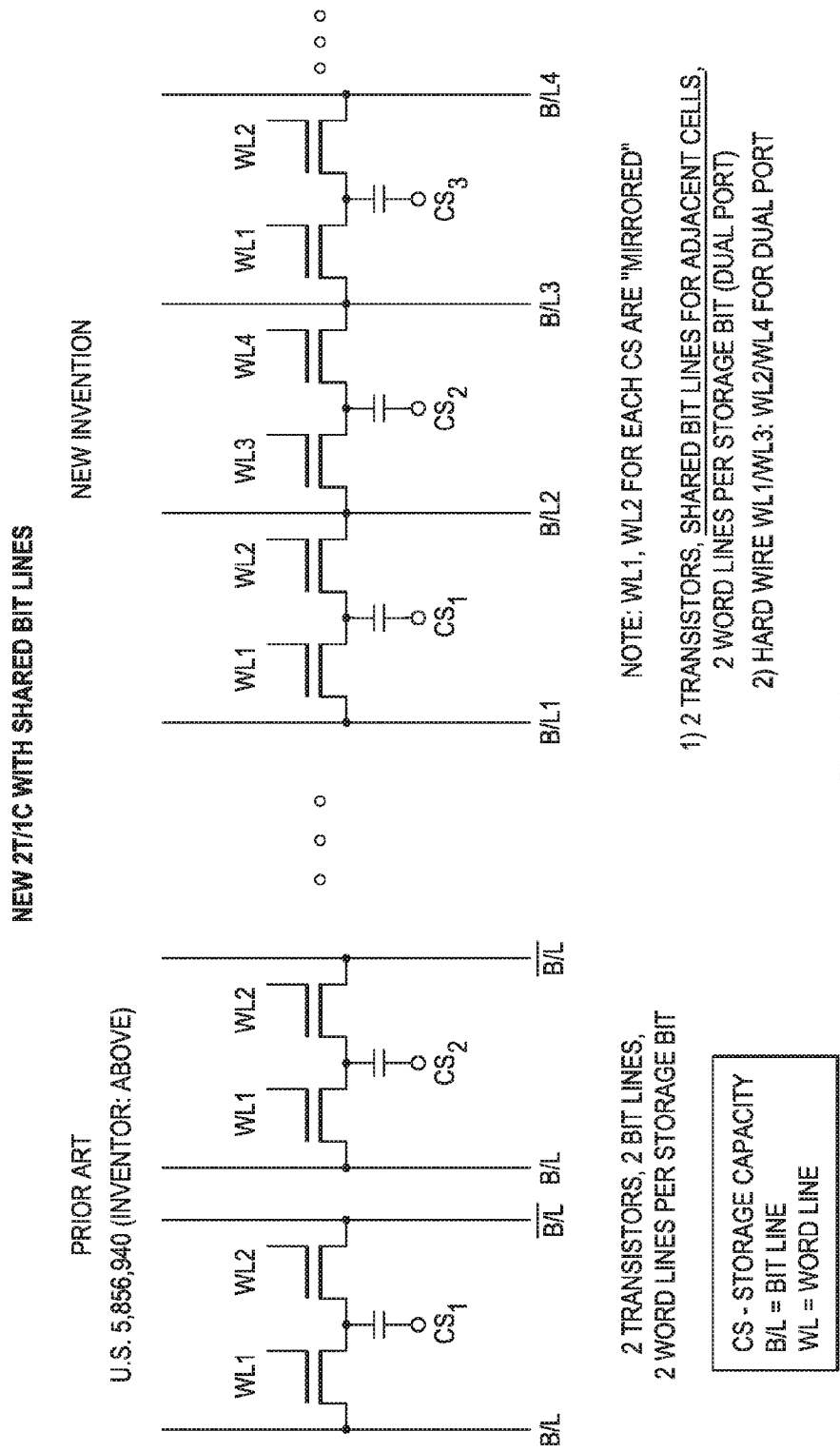
FIG. 11 shows how the "random access memory" of this invention can be implemented in dual port access for enhanced performance.
Figure 12:
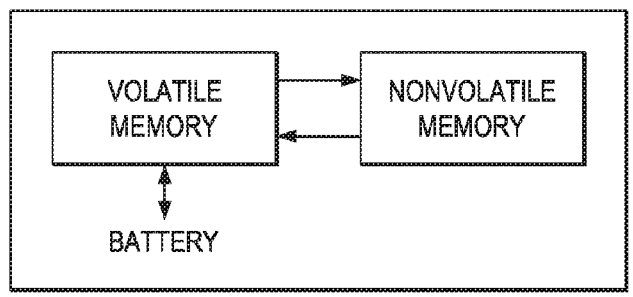
FIG. 12 shows a high level architecture of the NVMS of this invention which comprises both nonvolatile and volatile memory.

Control Page—Nonvolatile array communication with a 'Switch' where volatile and nonvolatile memory can be accessed (unlike current art)—then page 2 Kbytes can be used as independent RAM for other useful purposes. One preferred embodiment—Select any of the currently unused blocks and use that/those pages as a modified SRAM; access that SRAM by currently used NC pins and rename them. Even with "concurrent Read/Write", "write cache buffering" and other features, most blocks among the (1,024 or more) many in a NAND flash chip are unused while one or two blocks are being accessed (read, write, erase). The associated "page buffers" are also unused and wasted. In this preferred embodiment, a page of the currently unused block's page (2K Bytesx 1K blocks is 2 MBytes of SRAM per chip—with a little overhead circuitry it can be 2 MBytes of SRAM with multiple port access as well) can be read and written (random page access, random access within a page, serial access from a page etc.). There are plenty of NC pins available in commercially available NAND flash ICs (one example is provided in FIG. 7)—we can configure NC pins to be used as Address, DATA, Command, Control in a combination. In parallel, the NAND flash can concurrently operate.

The concepts of SRAM mode by using available pages can also be implemented in Samsung's one NAND™ flash (for example), NOR flash or even Serial EEPROM flash— The exact implementation, page/latch size, command set may vary. The concepts of SRAM mode by using available pages can also be implemented in traditional NOR flash, as well, with slight modifications (e.g., one row equivalent page in every block or sector, on chip cache, boot code, data buffers). The concepts of SRAM mode can also be implemented in other nonvolatile memory devices (and their controllers) e.g., FeRAM, MRAM, Phase change RAM/ memory, CNT RAM, NROM (Saifun) and similar ones. All these concepts can configure the multiple functions of the device or combination there of by (1) control/command signals, (2) programmable registers, (3) mode registers, (4) command register, etc—they can reside in part or in whole in controller, memory, special control, command, interface chip or even CPU.

It should be made clear that the "pages" and "buffers" mentioned in these pages titled "NVMS" do not necessarily have to be (1) static latches (6 transistor latches) or (2) traditional SRAM's. They can be DRAM's as is known widely in the industry. They can be MRAM, FeRAM (ferroelectric) or other similar concepts (molecular RAM etc). The implementation of a nonvolatile memory system may contain these configurable NVMS chips as described here (one or more). Configurable NVMS can be combined with commodity NOR/NAND/One NAND, flash chips, controllers, PSRAM's, DRAM's, or other similar functions to offer a total "system-in-package" (SIP) or "system-on-chip" (SOC).

In order to conserve operating power, the unselected, yet available pages can be in a "stand by" mode—namely, reduced Vcc (power supply voltage), until the access to that page is required. Such a, 'cycle look ahead', can be built into the memory chip, or provided by controller (on chip or off chip). A battery back up for the SRAM part of the device can be a very attractive option for a very large density total nonvolatile static random access memory (NVSRAM) that can go into a broad range of applications in computer, consumer, communications etc. Maxim supplies NVS-RAM's—no flash IC in NVSRAM. A "power triggered switch-off/on" (Similar to what Simtek's NVSRAM's do) is also possible, thus eliminating the "battery option".

Commands/Instructions are given as follows, in a preferred embodiment, which vary between NAND, One NAND, NOR, serial flash etc. Traditional flash: Read page in flash, Erase block in flash, Program page in flash, Etc. New commands with these inventions: Read page as SRAM/ RAM, Write page as SRAM/RAM, Read/Modify/W Write page as SRAM/RAM, Read byte out of a page, etc; Write byte out of a page etc. Nibble mode/Serial access/double data rate are all possible.

The "address boundary" for a commercial NAND flash (especially in burst mode access e.g., burst READ) is different than a "2K byte" NAND flash page. The address boundary does/should not deter by using the inventions mentioned here for a superior READ (intelligent caching) or WRITE performance. Most flash systems are weighted to MOSTLY READ and FEW ERASE/PROGRAM (WRITE) due to the obvious endurance limitations (write/erase cycles limit). Hence, any performance in READ—Speed, and available Storage space—is always beneficial to a stand alone die and/or card, module, subsystem, system. To write to a page or pseudo page, WRITE command and immediately PROGRAM SUSPEND to invalidate writing into NVM. The data should be in page/pseudo page. This is one example.

As described in earlier pages, the page latches are available for reading. The pages can be read a byte (8 bits) or 2 bytes (16 bits) at a time. The whole page 2K bytes, can be sequentially accessed in 20-25 ns/byte. The subject invention uses the pages as a content addressable memory (CAM) and the NVM core as the stored data. The match lines (as used in CAM's—refer to U.S. Pat. Nos. 6,310,880 and 6,597,596 which use a DRAM storage) can be connected to the pages. The addresses in each block can be sequentially read, until the MATCH is found.

What is claimed is:

1. A nonvolatile memory system comprising:
    a nonvolatile memory for storage of digital information arranged in multiple blocks for access;
    a volatile random access memory for read and write operations coupled to said nonvolatile memory;
    wherein the volatile random access memory and nonvolatile memory are controlled by one or more controllers;
    wherein the nonvolatile memory system is coupled to a central processing unit;
    wherein each block of the nonvolatile memory for storage has one or more pages of stored data accessible through the coupled volatile random access memory; and
    wherein each page of a block is adapted to be substituted on the fly for any other page of a different block through address mapping;
    wherein the one or more controllers control the volatile and nonvolatile memories to:
    perform a read operation on the portion of the digital information to be read and retrieving and storing such from the given block at the associated addressable location,
    perform a read operation from the volatile memory of any portion or all of the stored digital information in the volatile memory,
    perform a write operation on any portion of the accessed read digital information from the volatile memory back to the same physical location in the volatile memory for storage therein, and
    write the digital information stored in the volatile memory back to the nonvolatile memory at a different physical location with the same associated address from which it was read.

2. The nonvolatile memory system of claim 1 wherein the nonvolatile memory for storage is a floating gate flash memory.

3. The nonvolatile memory system of claim 1 wherein the nonvolatile memory for storage is a phase change memory.

4. The nonvolatile memory system of claim 1 wherein the nonvolatile memory for storage is a magnetic memory.

5. The nonvolatile memory system of claim 1 wherein the nonvolatile memory for storage is a ferroelectric memory.

6. The nonvolatile memory system of claim 1 wherein the nonvolatile memory for storage is a molecular memory.

7. The nonvolatile memory system of claim 1 wherein the volatile random access memory is a SRAM with at least one port for read and write access.

8. The nonvolatile memory system of claim 1 wherein the volatile random access memory is a dynamic random access memory with at least one port for read and write access.

9. The nonvolatile memory system of claim 1 wherein the volatile random access memory is a pseudo static RAM with at least one port for read and write access.

10. The nonvolatile memory system of claim 1 wherein the pages are randomly addressable and accessible.

11. The nonvolatile memory system of claim 10 wherein each of the randomly addressable and accessible pages is capable of addressing at least one bit in each access.

12. The nonvolatile memory system of claim 1 wherein the pages are serially addressable and accessible.

13. The nonvolatile memory system of claim 1 wherein the pages are randomly and serially addressable and accessible.

* * * * *

(12) INTER PARTES REVIEW CERTIFICATE (2788th)
United States Patent
Rao

(10) Number: US 9,792,219 K1
(45) Certificate Issued: Aug. 5, 2022

(54) NONVOLATILE MEMORY SYSTEMS WITH EMBEDDED FAST READ AND WRITE MEMORIES

(71) Applicant: G. R. Mohan Rao

(72) Inventor: G. R. Mohan Rao

(73) Assignee: FLASH-CONTROL, LLC

Trial Number:

IPR2020-01710 filed Sep. 29, 2020

Inter Partes Review Certificate for:

Patent No.: 9,792,219
Issued: Oct. 17, 2017
Appl. No.: 15/018,599
Filed: Feb. 8, 2016

The results of IPR2020-01710 are reflected in this inter partes review certificate under 35 U.S.C. 318(b).

INTER PARTES REVIEW CERTIFICATE
U.S. Patent 9,792,219 K1
Trial No. IPR2020-01710
Certificate Issued Aug. 5, 2022

AS A RESULT OF THE INTER PARTES REVIEW PROCEEDING, IT HAS BEEN DETERMINED THAT:

Claims 1-5 and 7-13 are cancelled.

\* \* \* \* \*